United States Patent
Molas et al.

(10) Patent No.: US 12,165,706 B2
(45) Date of Patent: Dec. 10, 2024

(54) METHOD FOR RESETTING AN ARRAY OF RESISTIVE MEMORY CELLS

(71) Applicants: COMMISSARIAT À L'ÉNERGIE ATOMIQUE ET AUX ÉNERGIES ALTERNATIVES, Paris (FR); WEEBIT NANO LTD, Hod-Hasharon (IL)

(72) Inventors: Gabriel Molas, Grenoble (FR); Alessandro Bricalli, Grenoble (FR); Guiseppe Piccolboni, Verona (IT); Amir Regev, Modiin (IL)

(73) Assignees: COMMISSARIAT À L'ENERGIE ATOMIQUE ET AUX ÉNERGIES ALTERNATIVES, Paris (FR); WEEBIT NANO LTD, Hod-Hasharon (IL)

( * ) Notice: Subject to any disclaimer, the term of this patent is extended or adjusted under 35 U.S.C. 154(b) by 121 days.

(21) Appl. No.: 17/782,423

(22) PCT Filed: Dec. 1, 2020

(86) PCT No.: PCT/EP2020/084094
§ 371 (c)(1),
(2) Date: Jun. 3, 2022

(87) PCT Pub. No.: WO2021/110666
PCT Pub. Date: Jun. 10, 2021

(65) Prior Publication Data
US 2023/0008586 A1    Jan. 12, 2023

(30) Foreign Application Priority Data
Dec. 4, 2019    (EP) ................................ 19306570

(51) Int. Cl.
*G11C 13/00*    (2006.01)

(52) U.S. Cl.
CPC ...... *G11C 13/0097* (2013.01); *G11C 13/0069* (2013.01)

(58) Field of Classification Search
CPC .......................... G11C 13/0097; G11C 13/00
(Continued)

(56) References Cited

U.S. PATENT DOCUMENTS

| 8,355,275 B2 * | 1/2013 | Ichihara | ............ G11C 13/0007 365/189.16 |
| 9,959,928 B1 * | 5/2018 | Hsu | ..................... G11C 13/0007 |

(Continued)

OTHER PUBLICATIONS

Vianello,E.,et al.,"Resistive Memories for Ultra-Low-Power embedded computing design," IEEE Internationa lElectron Devices Meeting,(2014),3 pages.*
(Continued)

*Primary Examiner* — Muna A Techane
(74) *Attorney, Agent, or Firm* — Pillsbury Winthrop Shaw Pittman LLP

(57) ABSTRACT

A method for resetting an array of RAM cells by applying a sequence of N reset operations, the method including at a first reset operation, defining a first reset technique and performing the first reset operation; at a j-th reset operation of a N–1 subsequent reset operations, j being an integer between 2 and N, if a correction yield of the reset technique used at the (j–1)-th reset operation fulfils a predefined condition, applying the reset technique used at the (j–1)-th reset operation to perform the j-th reset operation, if the correction yield does not fulfil the predefined condition, defining a new reset technique and applying the new reset technique to perform the j-th reset operation, the correction yield being a cumulative correction yield or a relative correction yield, the correction yield for the N reset operations being measured prior to the first reset operation.

12 Claims, 5 Drawing Sheets

(58) Field of Classification Search
USPC .......................................................... 365/148
See application file for complete search history.

(56) References Cited

U.S. PATENT DOCUMENTS

| 2013/0250657 | A1* | 9/2013 | Haukness | .......... | G11C 13/0064 |
| | | | | | 365/148 |
| 2014/0063907 | A1* | 3/2014 | Matsunami | ........ | G11C 13/0097 |
| | | | | | 365/148 |
| 2016/0336066 | A1* | 11/2016 | Lin | ................... | G11C 13/0064 |

OTHER PUBLICATIONS

International Search Report as issued in International Patent Application No. PCT/EP2020/084094, dated Feb. 10, 2021.

\* cited by examiner

METHOD FOR RESETTING AN ARRAY OF RESISTIVE MEMORY CELLS

CROSS-REFERENCE TO RELATED APPLICATIONS

This application is the U.S. National Stage of International Application Serial No. PCT/EP2020/084094, filed Dec. 1, 2020, which in turn claims priority to European Application No. 19306570.3, filed Dec. 4, 2019. The contents of all of these applications are incorporated herein by reference in their entirety.

TECHNICAL FIELD OF THE INVENTION

The invention belongs to the technical field of the Resistive Memory (RM) Cells. One object of the invention is a method for fast and efficient resetting or reprogramming an array of resistive Memory Cells in order to improve its memory window.

STATE OF THE ART

A Resistive Memory (RM) is a type of rewritable non-volatile memory cell. A RM cell comprises at least a first and a second electrode separated by an electrically insulating material. The application of a difference of electric potential to the two electrodes leads to the formation or the destruction of an electrical connection between the two electrodes. RM cells find application in the realization of Random-Access Memories arrays called Resistive Random-Access Memories (ReRAM).

The formation of the electrical connection between the two electrodes corresponds to the low resistance state (LRS) of the RM cell. This state is also called ON state or conducting state. When the electrical connection is removed, the RM cell is in the high resistance state (HRS). This state is also called OFF state or insulating state. The electrical resistance associated to the LRS is called $R_{LRS}$, while the electric resistance associated to the HRS is called $R_{HRS}$.

The existence of these two ON/OFF states makes it possible to use the RM cell as a rewritable non-volatile memory by encoding one bit of information. A RM cell is also called a memory point.

Several mechanisms may be responsible for the formation of the electrical connection between the two electrodes (see for example the article "Resistive Memories for Ultra-Low-Power Embedded Computing Design" published by E. Vianello et al. in Electron Devices Meeting 2014 IEEE International). For example, in the case of memory cells known as OxRAM, an electric filament is formed by mobile ions present in the dielectric material separating the two electrodes. Alternatively, in resistive random-access memories known as CBRAM (Conductive Bridging RAM) one of the two electrodes supplies the ions which dissolving in the dielectric material form the filament. In ReRAM known as PCRAM (Phase Change RAM), the two electrodes are separated by a programmable region comprising a material able to change from crystalline to amorphous phase upon heating. In this case, the OFF state corresponds to the amorphous state of the programmable region, while the ON state corresponds to the crystalline state. PCRAM cells may also comprise a heater element inserted between the two electrodes and able to transform the applied voltage pulse in the heat necessary to modify the crystalline state of the programmable region.

During their utilisation, arrays of RM cells undergo a great number of SET and RESET operation. A SET operation comprises putting the cell in the LRS, a RESET operation comprises putting the cell in the HRS. The application of a SET followed by a RESET application or vice versa is called a cycle. Both SET and RESET operation can be performed by applying voltage pulses having opposite polarities.

Arrays of RM cells suffer from variability in the resistance value associated to HRS. FIG. 1 shows the distribution of the measured electric resistances for HRS and LRS in a ReRAM array after different number of cycles. This figure shows on the vertical axis the percentile of RM cells having a measured electrical resistance, represented on the horizontal axis. It is evident that, when in the HRS, memory points can have different resistance values and that the variability of the values $R_{HRS}$ is much higher than the variability of the values $L_{LRS}$. The large spreading of HRS leads to difficulties in distinguishing the two states, and thus correction techniques are required to narrow the distribution of resistance values in the array. In other words, ReRAM arrays in which the HRS and LRS states are not clearly distinguished may lead to errors in reading the array states and thus to ReRAM arrays that are not reliable.

One of the most used techniques to reduce the variability in the HRS is the full reprogramming of the cell in which a setting of the cell is followed by a resetting. FIG. 2a sketches the full reprograming of a cell, with the state of the cell moving along the state distribution after performing a SET/RESET sequence, indicated by the arrows along the HRS states. Due to the stochastic character of the filament formation, the resistive state will randomly move on any point of the corresponding distribution. If we introduce a Relative Correction Probability as the probability of finding a bit above a certain resistance threshold $R_{th}$ after reprogramming, this probability should be constant at each reprogramming iteration.

However, certain bits can deviate from this ideal behaviour and do not show a constant Relative Correction Probability. These bits need to be treated differently because the physical mechanism of their filament formation is inherently different. As a consequence, full reprogramming is not the most effective technique in this case.

Other correction techniques have been proposed, in order to stress more the cell during the set/reset operation, for instance by increasing the voltage pulse duration or amplitude.

In summary, among the proposed techniques there are:

Reprogram: if $R_{HRS}$ is too low after RESET, the cell is SET again before another RESET trial is performed. Reprogram sequence is thus SET+RESET.

Increased voltage: if $R_{HRS}$ is too low after RESET, another RESET iteration is applied, with a high applied voltage.

Increased time: if $R_{HRS}$ is too low after RESET, another RESET iteration is applied, with a longer applied pulse width.

Repeated pulse: if $R_{HRS}$ is too low after RESET, another RESET iteration is applied, keeping the same RESET pulse width and voltage amplitude.

Nevertheless, the person skilled in the art does not know any method to efficiently combine these techniques in order to obtain a reliable, fast and efficient resetting of an array of RM cells.

GENERAL SUMMARY OF THE INVENTION

To at least partially solve the technical problems mentioned above, the present invention discloses a method for resetting an array of Resistive Memory cells by applying a sequence of N reset operations, N being an integer number greater than 2, said method comprising the following steps:

at the first reset operation, defining a first reset technique and performing the first reset operation by applying said first reset technique;

at a j-th reset operation of the N−1 subsequent reset operations, j being an integer number comprised between 2 and N, if a correction yield of the reset technique used at the (j−1)-th reset operation fulfils a predefined condition, applying said reset technique used at the (j−1)-th reset operation to perform the j-th reset operation, if the correction yield of the reset technique used at the (j−1)-th reset operation does not fulfil the predefined condition, defining a new reset technique and applying the new reset technique to perform the j-th reset operation, the correction yield being a cumulative correction yield or a relative correction yield, the correction yield for the N reset operations being measured prior to the first reset operation.

By resetting an array of RM cells is meant the operation of putting at least one of the cells of the array into the HRS. The resetting operation can also be called resetting operation, correction operation or correction step.

By Resistive Memory cell is meant any type of resistive memory cells, comprising Resistive Random-Access Memory ReRAM cells. Examples of ReRAM cells are OxRAM, CBRAM, PCRAM.

By a sequence of reset operation is meant a series of reset or correction operations in which each reset operation comprises the application of a reset or correction technique. The method according to the invention comprises the application of N reset operation or reset steps.

A correction yield for each of the reset techniques used and for each of the N reset operations performed is measured previously to the implementation of the method according to the invention.

By cumulative correction yield of a given technique is meant the cumulative correction yield or the relative correction yield of a given reset technique at a given reset operation.

By relative correction yield at the j-th reset operation is meant the fraction of cells that, being in the wrong resistive state at the (j−1)-th reset operation of the series, have been corrected by applying the given reset technique at the j-th reset operation of the series.

By cumulative correction yield at a given reset operation is meant the fraction of the cells in the array that are corrected by applying the reset technique at the j-th reset step.

The method according to the invention aims to establish an order for the application of the available reset or programming techniques, said order being based on proper figures of merit of the memory array. Thanks to the method disclosed by the invention, it is possible to choose an adapted sequence of reset techniques in order to obtain a fast and reliable resetting of a given array of RM cells.

The method according to the invention defines, at each correction step, the best reset technique for the correction step, i.e. the reset technique that meets a predetermined condition.

The first reset technique is chosen as the reset technique fulfilling a given criterium. For instance, the first reset technique may be the reset technique having the highest cumulative correction yield or the highest relative correction yield at the first reset operation.

The first reset technique is used also at the subsequent reset steps as long as a predetermined condition is fulfilled. If the first reset technique stops fulfilling the predetermined condition at the j-th reset operation, a new reset technique is defined and applied at the j-th reset operation. The new reset technique is then used at the subsequent reset operation, as long as it meets the predefined condition.

For instance, the predetermined condition can be that the reset technique must have a relative correction yield higher than a given threshold at the given correction step. In this way, the method according to the invention is able to correct the array of ReRAM cells in a fast way, by using at each step an efficient correction technique.

For example, if after some correction steps, the relative yield of the currently used reset technique goes below a predefined threshold, a new reset technique is chosen.

According to another example, when the first reset technique is chosen as the reset technique having the highest cumulative correction yield, the predetermined condition is that the difference between the cumulative yields of two subsequent reset operations is higher than a predefined threshold. In other words, the predetermined condition is that the derivative of the cumulative correction yield must be higher than a predefined threshold. When this condition is not fulfilled, a new reset technique is defined.

The new reset technique to be used at the j-th reset technique is for example the reset technique having the best relative or cumulative correction yield at the first reset operation and not yet used prior to the j-th reset operation.

Thanks to the knowledge of relative or the absolute correction yield at each reset step and for each of the reset techniques available, it is possible to dynamically adjust the reset technique used.

Advantageously, the method disclosed in the present invention allows to find and use the most efficient sequence of reset techniques for resetting an array of RM cells based on proper figure of merit of the array. By evaluating, at each reset step, the efficiency of the available reset techniques, a fully adapted sequence can be built.

By evaluating, at each resetting step of the N applied reset operations, the reset technique having a relative correction yield higher than a given threshold, the method according to the invention provides a fast correction sequence for a given array of RM cells. Moreover, the application of different reset techniques makes it possible to deal with the bits of the array having a non-ideal behaviour and to reduce the bit-to-bit variability.

The method according to the invention may also have one or more of the characteristics below, considered individually or according to all the technically possible combinations thereof:

the reset technique is chosen in a set of techniques comprising: reprogramming, applying voltage pulses with increasing amplitudes, applying voltage pulses with increasing temporal duration, applying voltage pulses with the same features;

said correction yield being the cumulative correction yield, the first reset technique is the reset technique having the highest cumulative correction yield at the first reset operation and the predefined condition is that the difference between the cumulative correction yields of two subsequent reset operations is higher than a predefined threshold;

the threshold for said difference is predefined depending on a saturation value of said difference, at which the difference between the cumulative correction yields of two subsequent reset saturates;

the threshold for said difference is predefined depending on the type of the Resistive Random-Access Memory cells;

the threshold for said difference is between 1% and 10%;

the new reset technique for the j-th reset operation is the correction technique that has the highest relative correction yield at the first reset operation and that has not been used prior to the j-th reset operation;

said correction yield being the relative correction yield, the first reset technique is the reset technique having the highest relative correction yield at the first reset operation and the predefined condition is that the relative correction yield at the j-th reset operation is higher than a predefined threshold;

the new reset technique for the j-th reset operation is the reset technique that has the highest cumulative correction yield at the first reset operation and that has not been used prior to the j-th reset operation;

said correction yield being the relative correction yield, the first reset operation is predefined and the predefined condition is that the relative correction yield at the j-th reset operation is higher than a predefined threshold;

the new reset technique is predefined;

the threshold for the relative correction yield is predefined depending on a saturation value at which the relative correction yield saturates;

the threshold for the relative correction yield is predefined depending on depending on the type of the Resistive Random-Access Memory cells;

the threshold for the relative correction yield is between 10% and 50%;

each reset operation is performed by applying a reset technique chosen among different available reset techniques;

the correction yield is measured, prior to the first reset operation, for each of said reset techniques and for each reset operation of a preliminary sequence of N reset operations, the correction yield being said cumulative correction yield or said relative correction yield, the cumulative correction yield being a fraction of the cells in the array that are corrected by applying the reset technique considered at the j-th reset operation of said preliminary sequence, the relative correction yield being a fraction of the cells in the array that, being in the wrong resistive state at the (j−1)-th rest operation of said preliminary sequence, are corrected by applying said reset technique at the j-th reset operation;

the number N of reset operations is comprised between 1 and 9;

the relative correction yield for the array of Resistive Memory cells to be reset is measured prior to the first reset operation;

the relative correction yield for the array of Resistive Memory cells is measured by performing N reset operation and measuring after each reset operation the resistance of the High-Resistive State of each cell;

the reprogramming reset technique comprises a step of set the array of Resistive Memory cells followed by a step of reset of the array of Resistive Memory cells;

when applying voltage pulses with increasing amplitudes, the increase step is comprised between 50 mV and 1 V;

when applying voltage pulses with increased temporal duration, the temporal width is increased by a decade.

LIST OF FIGURES

Other characteristics and advantages of the invention will become clear from the description given below for indicative purposes and in no way limiting, with reference to the appended figures, among which:

DETAILED DESCRIPTION OF THE INVENTION

A RM cell is a device comprising two electrodes separated by an insulating layer. It has two stable resistive states HRS and LRS and it is adapted to encode a bit of information in a rewritable, non-volatile memory device.

Prior to the application of the method according to the invention, the cumulative and/or the relative correction yields of the array RM cells must be characterized.

Figure 1:
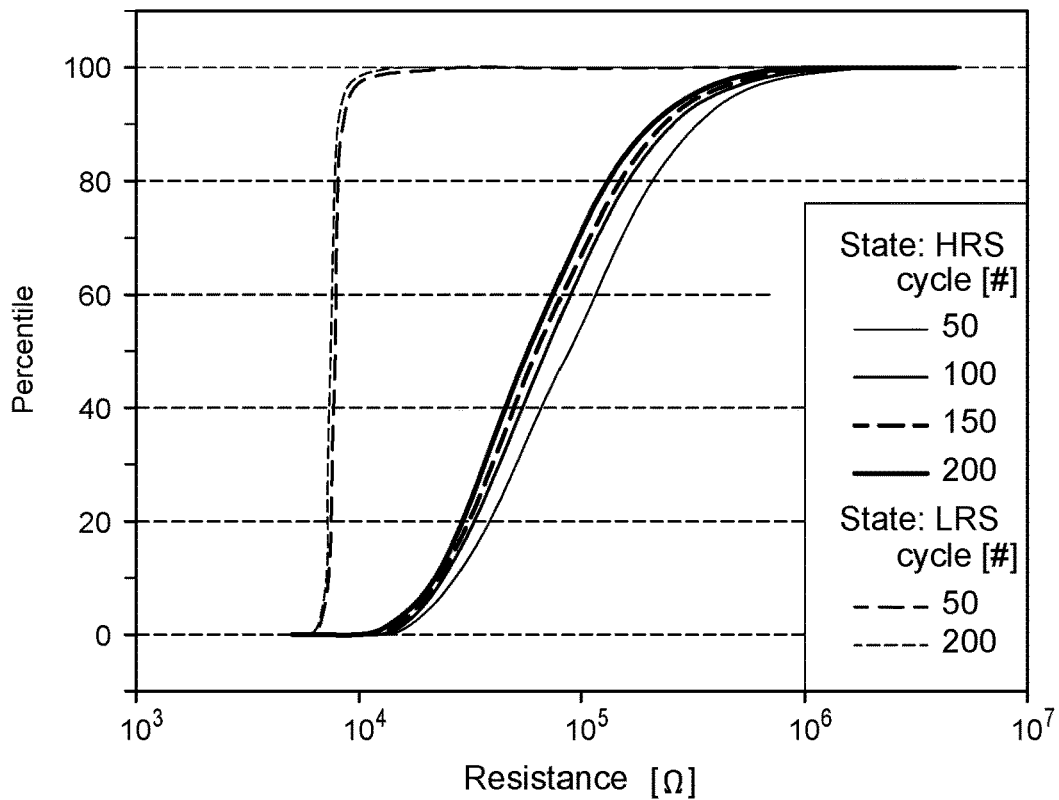
FIG. 1 represents the distribution of the $R_{HRS}$ and $R_{LRS}$ values for an array of RM cells.
Figure 2A:
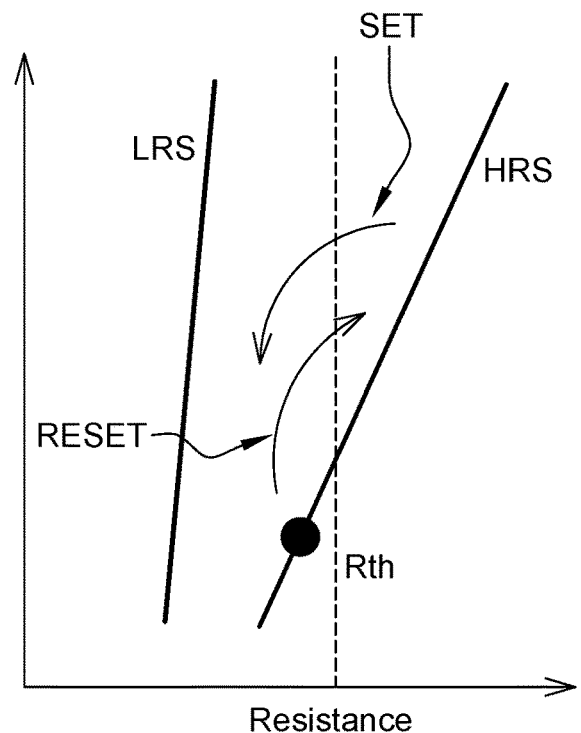
FIG. 2a represents how a RM cell changes its state after a full reprogramming status.
Figure 3A:
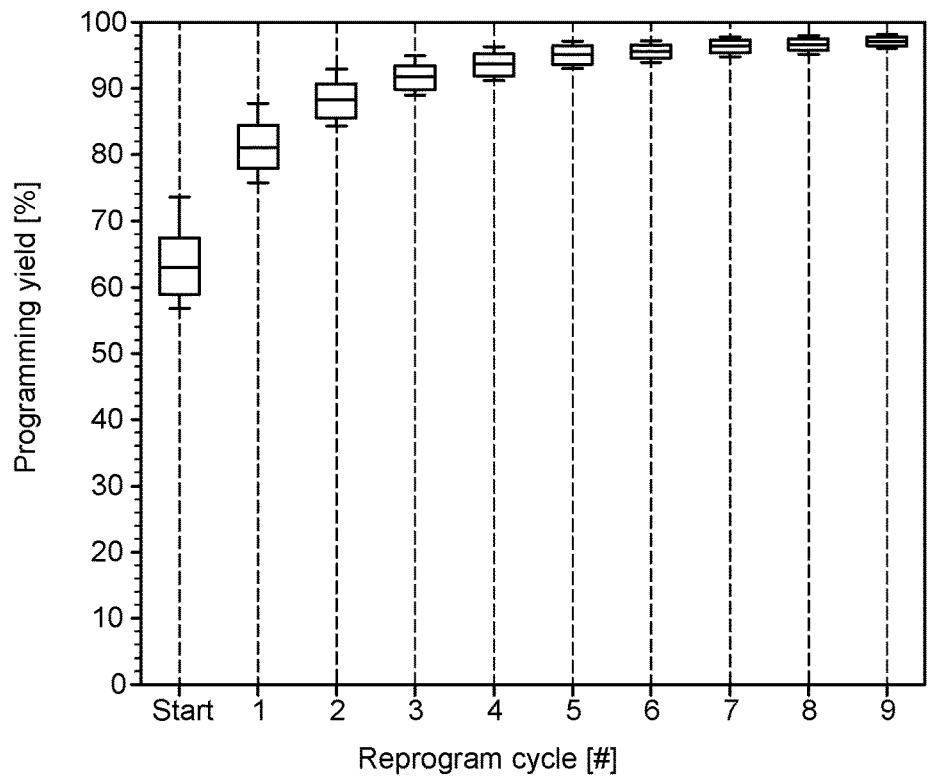
FIG. 3a represents the cumulative programming or correction yield for an array of RM cells as a function of the number of programming cycles.

FIG. 3a shows the cumulative programming yield or cumulative correction yield for an array of RM cells as a function of the number of reset operations or reprogramming cycles. The cumulative correction yield quantifies the percentage of cells over the entire array that were correctly programmed after each reprogramming step.

Figure 3B:
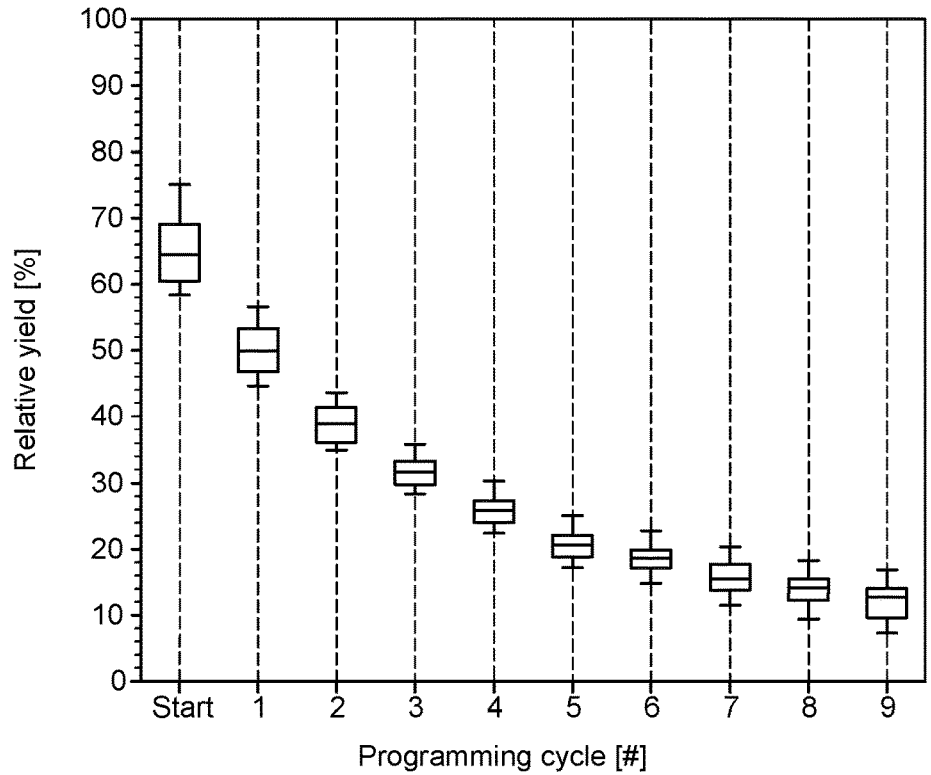
FIG. 3b represents the relative programming or correction yield for an array of RM cells as a function of the number of programming cycles.

FIG. 3b shows the relative programming yield or relative correction yield for an array of RM cells as a function of the number of reset operation or reprogramming cycles. The relative programming yield, on the other hand, represents the percentage of bad cells at the iteration j that were corrected at iteration j+1. In other words, the relative correction yield represents the percentage of cells that were not correctly reset at the reset operation j and that were corrected at iteration j+1.

Figure 4:
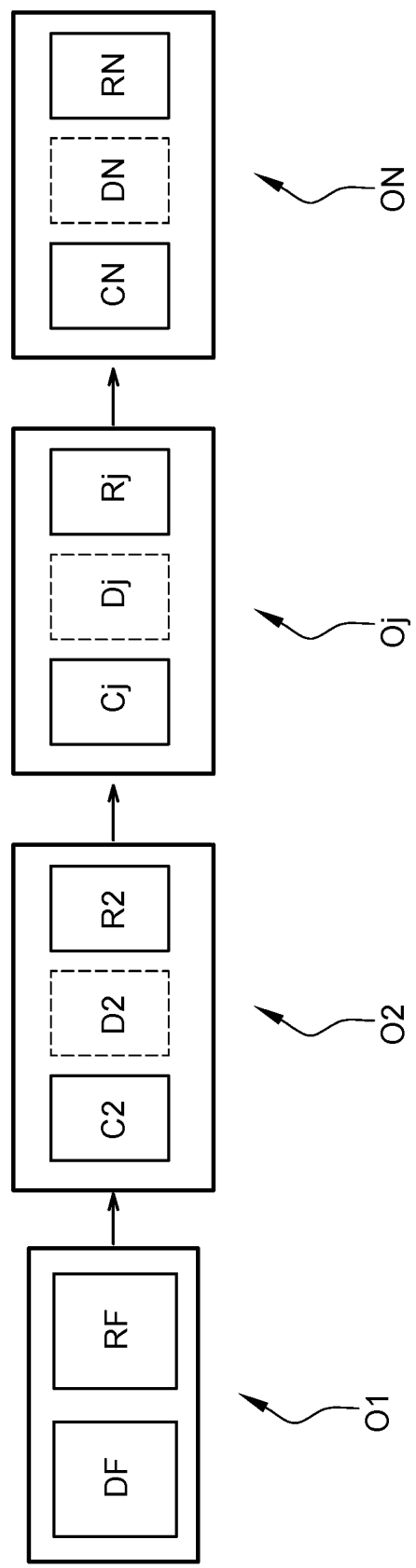
FIG. 4 represent a sketch of the method according to the invention.

FIG. 4 shows a sketch of the method according to the invention.

At the first reset operation O1, the first reset technique to be used is defined DF. This reset technique is used to perform the first reset operation RF.

According to an embodiment, the first reset technique is chosen as the reset technique having the highest cumulative yield at the first reset operation. Alternatively, the first reset technique is the reset technique having the highest relative correction yield at the first reset operation.

At the second j=2 reset operation O2, the reset technique used at the previous step is evaluated C2. If the previously used reset technique fulfils a predefined condition, this technique is applied to perform the second reset operation R2. Otherwise a new currently used reset technique is defined D2 and used to perform the second reset operation R2.

These steps Oj are repeated at the j-th reset operation and until the N-th and final reset operation, ON.

According to an embodiment, when the first reset operation is the technique having the highest cumulative yield, the predefined condition is that the difference in the cumulative yields of two subsequent reset operations must be higher than a predetermined threshold. For example, the threshold for this difference is comprised between 1% and 10%. In other words, the derivative of the cumulative yield as a function of the number of reset operations must be higher than a predetermined threshold. When this condition is no more met, another technique is chosen, for example the technique having the highest cumulative yield at the first reset operation and that has not been used prior to the j-th reset operation.

According to another embodiment, the first reset technique is chosen as the reset technique having the highest relative yield at the first reset operation. The predefined condition is then that at the j-th reset operation, the relative yield of the chosen technique must be higher than a predefined threshold. For example, the threshold can be comprised between 10% and 50%. When the predefined condition is no more met at the j-th reset operation, a new reset technique is used. For instance, the new reset technique at the j-th reset operation is the reset technique having the highest relative correction yield at the first reset operation and that has not been used prior to the j-th reset operation. For example, the first time that a new reset technique is chosen, the new reset technique will be the reset technique having the second-best relative yield at the first reset operation. The second time that a new reset technique is chosen, the new reset technique will be the reset technique having the third-best relative yield at the first reset operation.

In a similar way, at the third reset operation the reset technique used at the second step is evaluated. If it meets the predefined condition, it is used to perform the third reset operation. If it is not the case, a new reset technique is defined and used at the third reset step.

These steps are iterated for N reset operations, N being a predefined number.

Figure 5A:
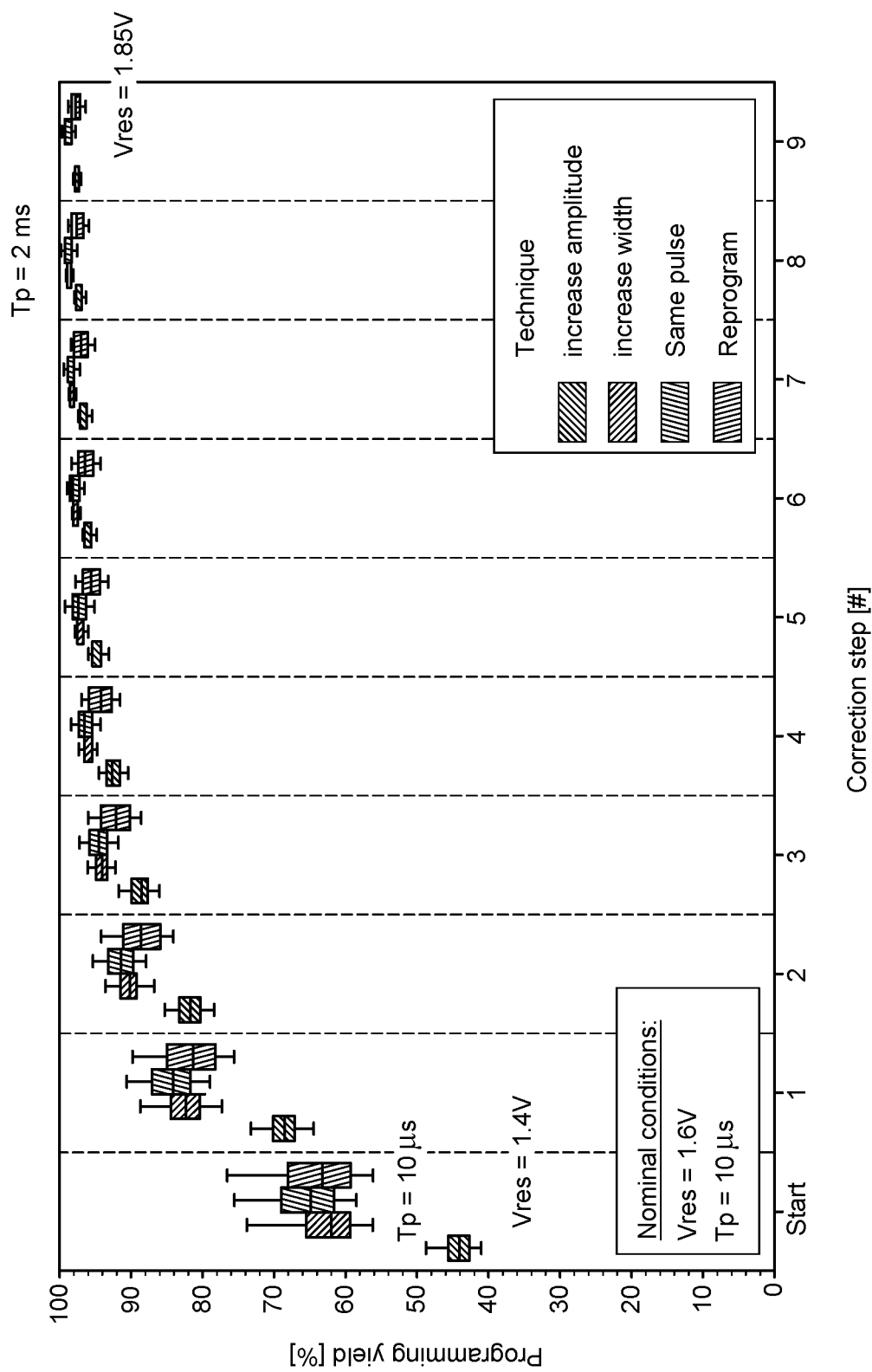
FIG. 5a represents the comparison of the cumulative correction yield of the four resetting techniques used by the method according to the invention.

A first embodiment of the method sketched in FIG. 4 is shown in FIG. 5a. In this case, looking at the cumulative yield of each technique, the starting one is chosen as the technique with the best absolute yield. Once the absolute yield is flattening, due to efficiency decrease, the technique with the 2nd best yield at the first reset operation is selected. In the case depicted in FIG. 5a, sending multiple reset pulses with the same pulse characteristics seems to provide the best correction yield at the first step: for this reason, this technique is chosen as the starting one. In order to quantify the efficiency saturation, the user has to calculate the delta between absolute yields (between cumulative correction yields) for two subsequent iterations. When this delta becomes lower than a specific criterion, it is considered that the efficiency saturates. As an example, assuming delta=2%, we can see in FIG. 4 that at cycle j=4, the criterion is reached. We then switch to the second most efficient technique at the first reset operation, in this case increasing pulse width IW. The procedure is then repeated. The threshold value must be a parameter decided by the engineer when implementing the method according to the invention. Indeed, not all the technologies, in particular not all the types of cells possible for such an array (OxRAM, PCRAM, CBRAM, . . . ), will have the same relative yield curves, meaning that they might saturate at different values. For example, for the type of RM cells of FIGS. 5a and 5b, the relative correction yield saturates at a saturation value that is about 12%. The saturation value in question is the value towards which the relative correction yield tends when the number of reset operations increases (in other words, it is its plateau value). And this saturation value usually depends, inter alia, on the type of the RM cells of the array, that is on whether they are OxRAM cells, PCRAM cells, CBRAM cells or still another type of RM cells.

As the threshold mentioned above is meant to detect whether the reset technique in use has reached saturation or not, it is interesting to predefine this threshold depending on the saturation value in question (more precisely, depending on the saturation value that corresponds to the type of the RM cells employed). The threshold value may be chosen as slightly above the saturation value in question. For instance, the threshold may be chosen as being equal to the saturation value considered multiplied by a coefficient between 1 and 3, or between 1 and 2.

As already explained, the criterion for switching from one reset technique to another (when the efficiency of reset technique in use saturates), may be based either on the relative correction yield or on the cumulative correction yield.

When this criterion is based on the relative correction yield, the threshold for the relative correction yield may be predefined based on the saturation value of the relative correction yield (as it has just been explained above).

When this criterion is based on the cumulative correction yield (like in the case of the first embodiment, of FIG. 4) the threshold in question is a threshold for the difference between the cumulative correction yields of two subsequent reset operations (for instance, two immediately successive reset operations). This threshold may then be determined similarly but based on a saturation value for the difference between the cumulative correction yields of two subsequent reset operations. In practice, this threshold may for instance range between 1% and 10%.

According to another embodiment, the user choses the technique with the best relative yield. Once the relative yield is flattening, due to efficiency decrease, we move to the next available technique with the 2nd best relative yield at the initial reset operation. A given technique is used until it reaches a specific threshold. Under this threshold, the technique efficiency is considered insufficient and the next one is used.

The sequence is then constructed as follows:
Identification of the method with the best initial relative yield. Repeating this method at each iteration step j until relative yield becomes lower than a threshold defined by the user. The threshold can be for instance 20% (or ranging typically between 10% and 50% depending on the technology).
Once the relative yield is lower than the threshold, moving to a second technique with the 2nd best relative yield at the first reset operation. Repeating this method at each iteration step until relative yield becomes lower than the threshold
Once the relative yield is lower than the threshold, moving to a second technique with the 3rd best relative yield at the first reset operation. Repeating this method at each iteration step until relative yield becomes lower than the threshold
Once the relative yield is lower than the threshold, moving to a second technique with the 4th best relative yield. Repeating this method at each iteration step until relative yield becomes lower than the threshold.

This example above is given assuming 4 methods are envisaged, but can be extended for any configuration with other numbers of envisaged methods.

Figure 5B:
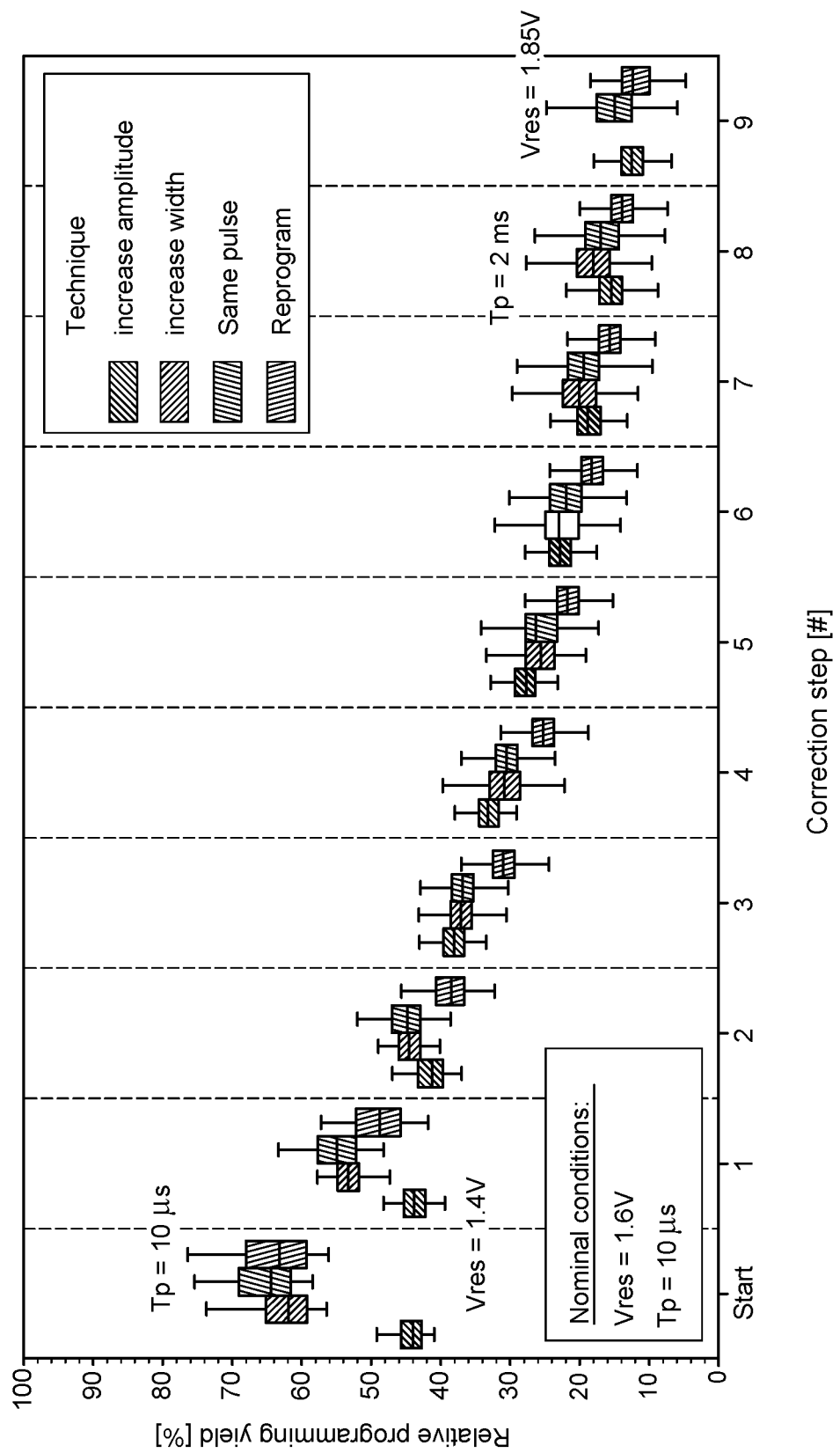
FIG. 5b represents the comparison of the relative correction yield of the four resetting techniques used by the method according to the invention.

Looking at FIG. 5b, assuming a threshold of 20% of minimum relative yield, the sequence would be: SP, SP, SP, SP, SP, SP, IW, IW, IW, IW, IW, IW, IW, R, R . . . .

Alternatively, the sequence can be built by considering the cumulative yield instead of the relative yield.

The figures of merit of FIGS. 3a and 3b have to be independently calculated for each correction technique to quantify their efficiency for each of the N reset operations.

In order to calculate these curves for a given RM technology used by a user, the following procedure can be followed:

For each programming technique, an array of resistive memory devices is chosen.
- Typical density is about 1 kb in order to have a large enough statistic.
- a. Memory devices are formed by applying a forming step, i.e.: a positive voltage pulse with sufficient duration. Forming conditions depend on the RM technology and they typically are a voltage pulse with amplitude comprised between 1V and 4V and applied for a time duration comprised between 100 ns and 10 μs.
- b. Some preliminary cycling can be applied to the cell if required by the user: about 10 cycles of SET/RESET will be realized, with the typical SET RESET conditions required for the chosen RM technology
- c. Then the reset technique will be evaluated. To this aim, the memories undergo a SET operation, and then a RESET sequence corresponding to the reset technique that has to be evaluated. In particular:

Reprogram R: successive SET+RESET sequences are repeated, with standard SET and RESET conditions.

Increased voltage IV: successive RESET operation with increased voltage are applied. Typically, the amplitude of the voltage pulse applied for the reset $V_{RESET}$ starts at the nominal value, and then is increased by a step that is comprised between 50 mV and 1V.

Increased time IW: successive RESET operation with increased pulse temporal width are applied. Typically, the pulse temporal width $t_{RESET}$ starts at the nominal value, and then is increased by a log step. As an example, between reset operation j+1 and reset operation j, the incremental time step $t_{j+1}$ can be calculated by $t_{j+1}/t_j=10^x$, x being for example 0.5 or 1. If case x=1, time is increased by one decade at each iteration.

Repeated or same pulse S: successive RESET operation with standard nominal conditions (time and voltage) are repeated.

In general, a maximum number of reset operation or corrections must be allowed: in FIG. 3, for example, we are allowing at most 9 corrections. This means that, at each cycle, the test routine will try to correct a wrong HRS up to 9 times with the technique that we are using (reprogramming, increasing $V_{reset}$ or increasing $T_{reset}$).

After the experiment, the readings of the HRS values are considered:

After each programming condition, for each iteration step, cell resistance is measured (reading operation) and compared to a targeted $R_{HRS}$. If $R>R_{HRS}$, the cell is considered RESET. If $R<R_{HRS}$, the RESET operation is considered as failed. It is thus possible to extract the yield for each iteration. Targeted $R_{HRS}$ can be for example $R_{LRS}$ multiplied by the window margin of the memory. Margin can be a factor 2 to 10 for example and is chosen by the user. $R_{LRS}$ depends on the programming current and technology. Typically, for $I_{prog}=100$ μA, $R_{LRS}$ is of the order of 10 kOhms. In this case, assuming margin=2 and $I_{prog}=100$ μA, this leads to targeted $R_{HRS}=20$ kOhms.

Then the user measures the percentage of cells that fail or pass after each iteration step, allowing to construct cumulative and relative correction yields for the tested smart techniques.

The cumulative correction yield is built by considering all the correction iterations one by one, and counting, at each cycle, how many cells have been corrected up to that particular iteration with respect to the total cells in the array. The boxes represent the statistics of the Cumulative Correction Yield at each iteration.

The relative correction yield is built by considering all the correction iterations one by one, and counting, at each cycle, how many cells have been corrected at that particular iteration with respect to the cells that were still bad at the previous iteration. The boxes represent the statistics of the cumulative correction yield at each iteration.

The invention claimed is:

1. A method for resetting an array of Resistive Random-Access Memory cells by applying a sequence of N reset operations, said method comprising:
   at a first reset operation, defining a first reset technique and performing the first reset operation by applying said first reset technique;
   at a j-th reset operation of a N−1 subsequent reset operations, j being an integer number comprised between 2 and N, if a correction yield of the reset technique used at the (j−1)-th reset operation fulfils a predefined condition, applying said reset technique used at the (j−1)-th reset operation to perform the j-th reset operation, if the correction yield of the reset technique used at the (j−1)-th reset operation does not fulfil the predefined condition, defining a new reset technique and applying the new reset technique to perform the j-th reset operation,
   the correction yield being a cumulative correction yield or a relative correction yield, the correction yield for the N reset operations being measured prior to the first reset operation,
   wherein
   when said correction yield is the cumulative correction yield, the first reset technique is the reset technique having the highest cumulative correction yield at the first reset operation and the predefined condition is that the difference between the cumulative correction yields of two subsequent reset operations is higher than a first predefined threshold, and
   when said correction yield is the relative correction yield, the first reset technique is the reset technique having the highest relative correction yield at the first reset operation and the predefined condition is that the relative correction yield at the j-th reset operation is higher than a second predefined threshold.

2. The method according to claim 1, wherein the reset technique is chosen in a set of techniques comprising: reprogramming, applying voltage pulses with increasing amplitudes, applying voltage pulses with increasing temporal duration, applying voltage pulses with same features.

3. The method according to claim 1, wherein the first predetermined threshold for said difference is predefined depending on a saturation value of said difference, at which the difference between the cumulative correction yields of two subsequent reset saturates.

4. The method according to claim 1, wherein the first predetermined threshold for said difference is predefined depending on a type of the Resistive Random-Access Memory cells.

5. The method according to claim 4, wherein the new reset technique for the j-th reset operation is the correction technique that has the highest cumulative correction yield at the first reset operation and that has not been used prior to the j-th reset operation.

6. The method according to claim 1, wherein the new reset technique for the j-th reset operation is the technique that has the highest relative correction yield at the first reset operation and that has not been used prior to the j-th reset operation.

7. The method according to claim 1, wherein said correction yield being the relative correction yield, the first reset operation is predefined and the predefined condition is that the relative correction yield at the j-th reset operation is higher than a predefined threshold.

8. The method according to claim 7, wherein the new reset technique is predefined.

9. The method according to claim 1, wherein the second predetermined threshold for the relative correction yield is predefined depending on a saturation value at which the relative correction yield saturates.

10. The method according to claim 1, wherein the second predetermined threshold for the relative correction yield is predefined depending on the type of the Resistive Random-Access Memory cells.

11. The method according to claim 1, wherein
each reset operation is performed by applying a reset technique chosen among different available reset techniques,
said correction yield is measured, prior to the first reset operation, for each of these reset techniques and for each reset operation of a preliminary sequence of N reset operations, the correction yield being said cumulative correction yield or said relative correction yield, the cumulative correction yield being a fraction of the cells in the array that are corrected by applying the reset technique considered at the j-th reset operation of said preliminary sequence, the relative correction yield being a fraction of the cells in the array that, being in the wrong resistive state at the (j−1)-th reset operation of said preliminary sequence, are corrected by applying said reset technique at the j-th reset operation.

12. The method according to claim 1 wherein the number N of reset operations is comprised between 1 and 9.

* * * * *